(12) United States Patent
Lee

(10) Patent No.: US 7,778,104 B2
(45) Date of Patent: Aug. 17, 2010

(54) SEMICONDUCTOR MEMORY APPARATUS

(75) Inventor: Joong-Ho Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 93 days.

(21) Appl. No.: 12/170,262

(22) Filed: Jul. 9, 2008

(65) Prior Publication Data

US 2009/0147614 A1 Jun. 11, 2009

(30) Foreign Application Priority Data

Dec. 7, 2007 (KR) ...................... 10-2007-0126681

(51) Int. Cl.
*G11C 11/00* (2006.01)
(52) U.S. Cl. .................................. 365/230.03; 365/205
(58) Field of Classification Search ............ 365/230.03, 365/205
See application file for complete search history.

(56) References Cited

U.S. PATENT DOCUMENTS

| 5,245,526 | A | * | 9/1993 | Balakrishnan et al. ........ 363/97 |
| 6,081,140 | A | * | 6/2000 | King ............................ 327/77 |
| 6,449,204 | B1 | * | 9/2002 | Arimoto et al. ............. 365/222 |
| 6,839,265 | B2 | | 1/2005 | Keeth |
| 7,317,646 | B2 | | 1/2008 | Yoon et al. |
| 2003/0103368 | A1 | * | 6/2003 | Arimoto et al. ............... 365/63 |

FOREIGN PATENT DOCUMENTS

| JP | 2000-114491 | | 4/2000 |
| KR | 1020060082941 | A | 7/2006 |
| KR | 100766377 | B1 | 10/2007 |

\* cited by examiner

*Primary Examiner*—Michael T Tran
(74) *Attorney, Agent, or Firm*—Baker & McKenzie LLP

(57) ABSTRACT

A semiconductor memory includes a cell mat configured to include a plurality of memory cells to which a first bit line pair or a second bit line pair is connected; a sense amplifier configured to amplify a positive sensing line and a negative sensing line in response to a first bit line equalize signal; a column selecting unit configured to connect the positive sensing line and the negative sensing line to a first data bus and a second data bus, respectively, in response to a column selection signal; and a share control unit configured to connect the positive sensing line and a positive first bit line of the first bit line pair or a positive second bit line of the second bit line pair in response to a second bit line equalize signal, a positive share control signal and a negative share control signal.

8 Claims, 5 Drawing Sheets

SEMICONDUCTOR MEMORY APPARATUS

RELATED APPLICATIONS INFORMATION

The present application claims the benefit under 35 U.S.C 119(a) to Korean Application No. 10-2007-0126681, filed on Dec. 7, 2007, in the Korean Intellectual Property Office, the disclosure of which is incorporated herein by reference in its entirety as if set forth in full.

BACKGROUND

1. Technical Field

The embodiments described herein relate to a semiconductor memory apparatus, and more particularly, to a memory block of a semiconductor memory apparatus that has an open bit line structure.

2. Related Art

A conventional dynamic random access memory (DRAM) includes a plurality of memory cells each of which has one transistor and one capacitor to store data. Each of the memory cells is connected to a word line and a bit line, and the word line is connected to a sub-word line driver and the bit line is connected to a bit line sense amplifier. The bit lines constitute bit line pairs, and data whose phases are opposite to each other is carried to each of the bit line pairs. Each of the bit line pairs is connected to a local data bus pair and it is determined whether each bit line and each local data bus are connected to each other according to a column selection signal that is generated by decoding a column address.

Hereinafter, a conventional memory block of a semiconductor memory apparatus will be described with reference to FIGS. 1 and 2.

FIG. 1 is a first exemplary view illustrating a configuration of the conventional memory block of a semiconductor memory apparatus, which exemplifies one of a plurality of cell mats that are included in the memory block and sense amplifiers disposed at both ends of the cell mat.

As shown in FIG. 1, the conventional memory block of the semiconductor memory apparatus includes a first cell mat 1 and first to fourth sense amplifiers 2-1 to 2-4 that are disposed at both ends of the first cell mat 1.

Four bit line pairs BL1 and /BL1 to BL4 and /BL4 are sequentially disposed in the first cell mat 1. Memory cells are disposed at intersections of the four bit line pairs BL1 and /BL1 to BL4 and /BL4 and six sub-word lines SWL1 to SWL6, respectively. In FIG. 1, a sub-word line driver block is not shown.

The first sense amplifier 2-1 is connected to the first cell mat 1 through the first bit line pair BL1 and /BL1. The second sense amplifier 2-2 is connected to the first cell mat 1 through the second bit line pair BL1 and /BL2. The third sense amplifier 2-3 is connected to the first cell mat 1 through the third bit line pair BL3 and /BL3. The fourth sense amplifier 2-4 is connected to the first cell mat 1 through the fourth bit line pair BL4 and /BL4.

In response to first and third column selection signals 'YS'<1,3>, a first column selecting unit 3-1 connects the first bit line pair BL1 and /BL1 that is connected to the first sense amplifier 2-1 and a first local data bus pair LIO1 and /LIO1, and the third bit line pair BL3 and /BL3 that is connected to the third sense amplifier 2-3 and a third local data bus pair LIO3 and /LIO3. In response to second and fourth column selection signals 'YS'<2,4>, a second column selecting unit 3-2 connects the second bit line pair BL2 and /BL2 that is connected to the second sense amplifier 2-2 and a second local data bus pair LIO2 and /LIO2, and the fourth bit line pair BL4 and /BL4 that is connected to the fourth sense amplifier 2-4 and a fourth local data bus pair LIO4 and /LIO4.

In order to increase the integration of the memory block of the semiconductor memory apparatus, the conventional semiconductor memory apparatus implements a memory block having an open bit line structure. That is, each of the bit line sense amplifiers is connected to a different cell mat through the positive bit line BL and the negative bit line /BL. As a result, in the arrangement of memory cells in the cell mats, extra space is removed, allowing dense arrangement of the memory cells.

FIG. 2 is a second exemplary view illustrating a configuration of the conventional memory block of the semiconductor memory apparatus according to the related art, which illustrates the memory block having an open bit line structure. Specifically, FIG. 2 exemplifies two mats among a plurality of cell mats included in the memory block and sense amplifiers that are disposed between the two cell mats.

As shown in FIG. 2, the conventional memory block of the semiconductor memory apparatus includes a first cell mat 4, a second cell mat 5, and first to fourth sense amplifiers 6-1 to 6-4 that are disposed between the first cell mat 4 and the second cell mat 5.

In the first cell mat 4, four bit line pairs BL1 and /BL1 to BL4 and /BL4 are sequentially disposed, and memory cells are respectively provided at intersections of the four bit line pairs BL1 and /BL1 to BL4 to /BL4 and the six sub-word lines SWL1 to SWL6. The second cell mat 5 has the same structure as the first cell mat 4 except for the arrangement order of the four bit line pairs /BL1 and BL1 to /BL4 and BL4. In FIG. 2, a sub-word line driver block is not shown.

The first sense amplifier 6-1 is connected to the first cell mat 4 through the positive first bit line BL1 and to the second cell mat 5 through the negative first bit line /BL1. The second sense amplifier 6-2 is connected to the first cell mat 4 through the positive second bit line BL2 and to the second cell mat 5 through the negative second bit line /BL2. The third sense amplifier 6-3 is connected to the first cell mat 4 through the positive third bit line BL3 and to the second cell mat 5 through the negative third bit line /BL3. The fourth sense amplifier 6-4 is connected to the first cell mat 4 through the positive fourth bit line BL4 and to the second cell mat 5 through the negative fourth bit line /BL4.

The first to fourth sense amplifiers 6-1 to 6-4 operate in response to a bit line equalize signal 'bleq'. When the bit line equalize signal 'bleq' is disabled, the first to fourth sense amplifiers 6-1 to 6-4 amplify the positive bit line and the negative bit line or the negative bit line and the positive bit line at a level of a first sense amplifier power supply voltage (in this case, RTO voltage RTO) to perform a high-level sensing operation and a level of a second sense amplifier power supply voltage (in this case, SB voltage SB) to perform a low-level sensing operation. Meanwhile, when the bit line equalize signal 'bleq' is enabled, the first to fourth sense amplifiers 6-1 to 6-4 precharge the positive bit line and the negative bit line with a level of a bit line precharge voltage Vblp.

Although not shown in the drawing, sense amplifiers, which are connected to the first cell mat 4 through the negative first to fourth bit lines /BL1 to /BL4, may exist at the left side of the first cell mat 4. Further, sense amplifiers, which are connected to the second cell mat 5 through the positive first to fourth bit lines BL1 to BL4, may exist at the right side of the second cell mat 5.

In response to first to fourth column selection signals 'YS'<1:4>, a first column selecting unit 7-1 connects the positive first to fourth bit lines BL1 to BL4 that are connected to the first cell mat 4 and the positive first to fourth local data buses LI01 to LI04. In response to the first to fourth column selection signals 'YS'<1:4>, the second column selecting unit 7-2 connects the negative first to fourth bit lines /BL1 to /BL4 that are connected to the fifth cell mat 5 and the negative first to fourth local data buses /LI01 to /LI04.

As described above, the conventional memory block of the semiconductor memory apparatus includes four sense amplifiers in order to amplify the four positive bit lines of the first cell mat 4 and the four negative bit lines of the second cell mat 5. That is, the conventional semiconductor memory apparatus includes the same number of sense amplifiers as bit line pairs. However, as is well known, each of the sense amplifiers includes several transistors and occupies a wide area, which makes it difficult to achieve high integration of the memory block. As shown in FIG. 2, due to the arrangement of the sense amplifiers, extra space is generated in each of the sense amplifier blocks, which results in lowering the integration of the memory block.

That is, as described above, in order to achieve the high integration of the semiconductor memory apparatus, efficient space arrangement of the memory block is required. However, because the conventional memory block requires sense amplifiers corresponding to bit line pairs, it is difficult to secure sufficient area margin in order to increase the integration of the memory block. Further, extra space is generated between the sense amplifiers, which results in lower spatial utilization efficiency.

SUMMARY

A semiconductor memory apparatus capable of increasing an area margin is described herein.

In one aspect, a semiconductor memory apparatus can include a cell mat configured to include a plurality of memory cells to which a first bit line pair or a second bit line pair is connected; a sense amplifier configured to amplify a positive sensing line and a negative sensing line in response to a first bit line equalize signal; a column selecting units configured to connect the positive sensing line and the negative sensing line to a first data bus and a second data bus, respectively, in response to a column selection signal; and a share control unit configured to connect the positive sensing line and a positive first bit line of the first bit line pair or a positive second bit line of the second bit line pair in response to a second bit line equalize signal, a positive share control signal and a negative share control signal.

In another aspect, a semiconductor memory apparatus can include a first cell mat configured to have a plurality of positive bit lines and negative bit lines alternately disposed therein; a second cell mat configured to be disposed apart from the first cell mat at a predetermined distance and to have a plurality of negative bit lines and positive bit lines alternately disposed therein; and a sense amplifier configured to amplify a positive first bit line of the first cell mat and a negative first bit line of the second cell mat or a positive second bit line of the first cell mat and a negative second bit line of the second cell mat in response to first and second bit line equalize signals, a positive share control signal and a negative share control signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

According to the embodiments described herein, A semiconductor memory apparatus capable of increasing an area margin is described herein in detail with reference to the accompanying drawings.

Figure 1:
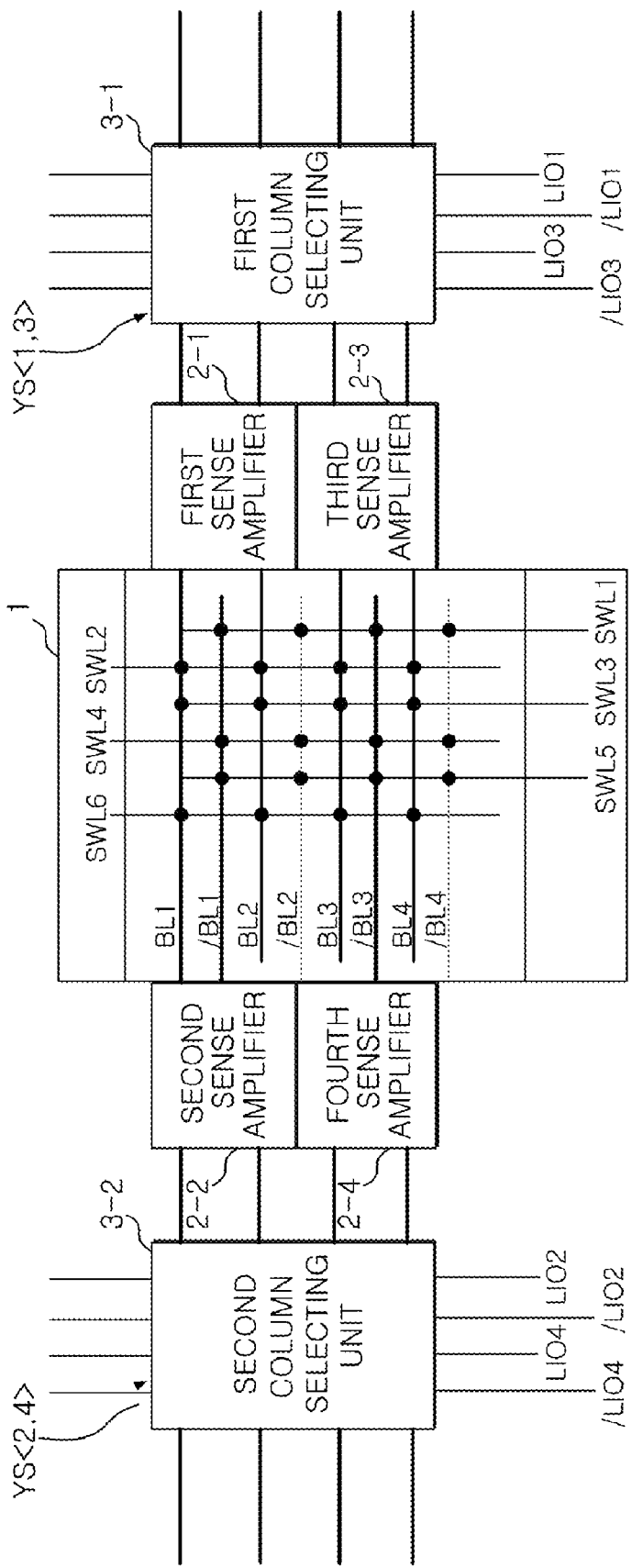
FIG. 1 is an exemplary view illustrating a configuration of a conventional memory block of a semiconductor memory apparatus.
Figure 2:
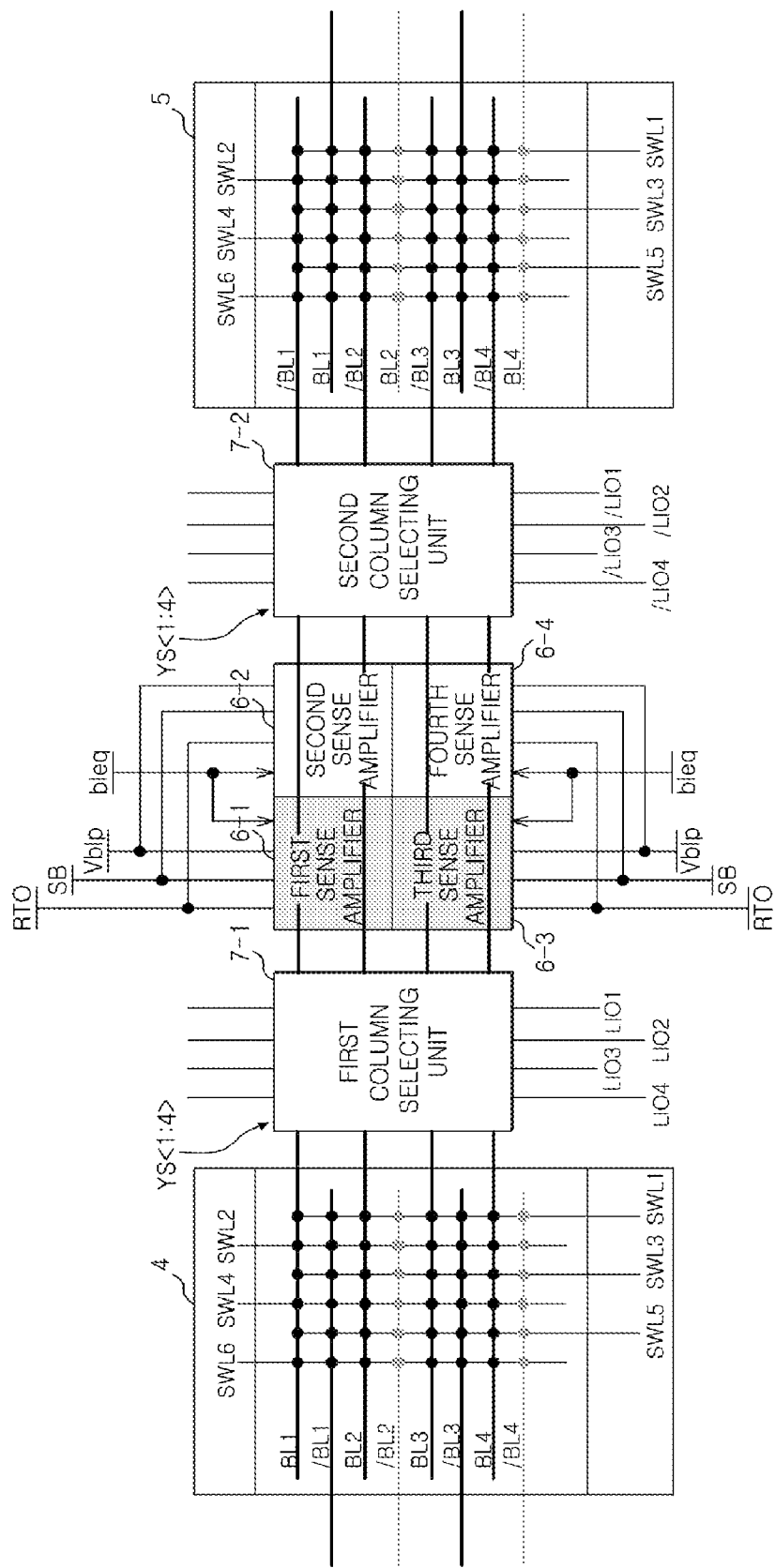
FIG. 2 is a second exemplary view illustrating a configuration of a conventional memory block of a semiconductor memory apparatus.
Figure 3:
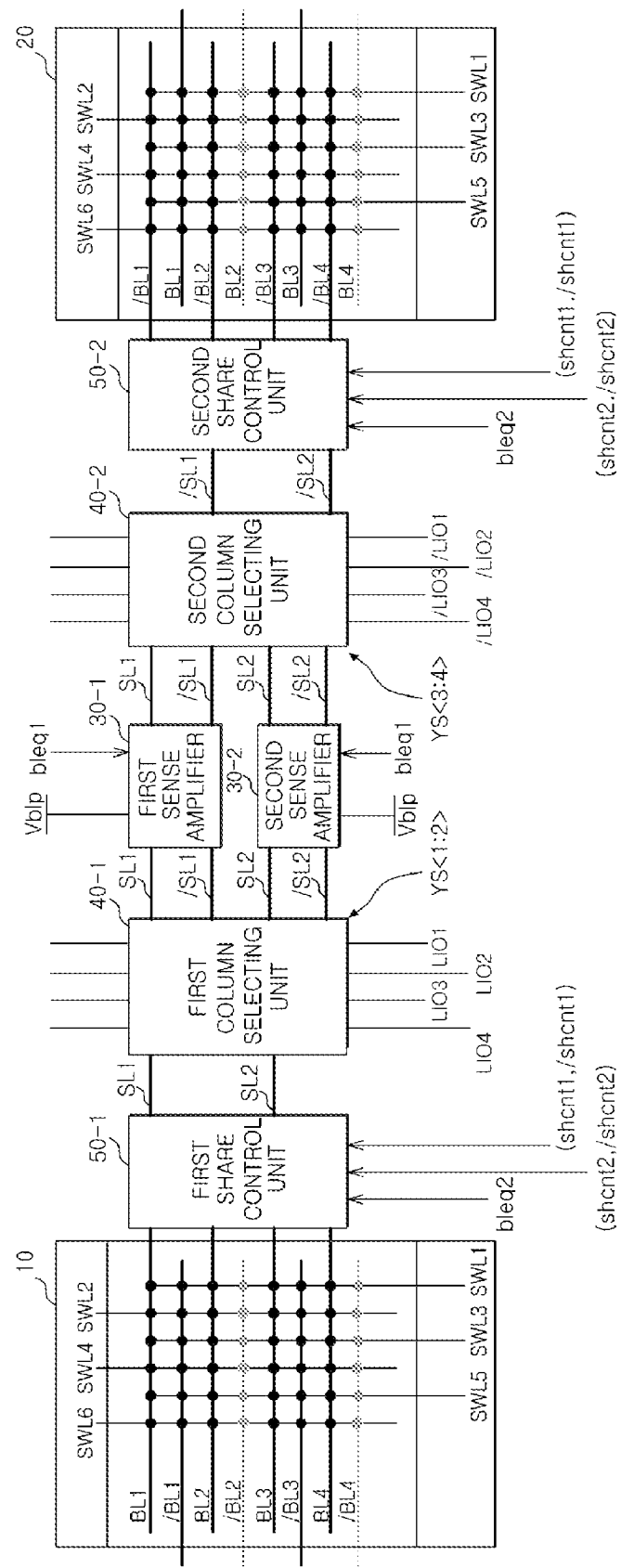
FIG. 3 is a block diagram illustrating a configuration of a memory block of a semiconductor memory apparatus according to one embodiment.

FIG. 3 is a block diagram illustrating a configuration of a memory block of a semiconductor memory apparatus according to one embodiment, which exemplifies two cell mats among a plurality of cell mats included in a memory block and sense amplifiers disposed between the two cell mats.

As illustrated in FIG. 3, a memory block of a semiconductor memory apparatus according to one embodiment can include a first cell mat 10, a second cell mat 20, a first sense amplifier 30-1, a second sense amplifier 30-2, a first column selecting unit 40-1, a second column selecting unit 40-2, a first share control unit 50-1, and a second share control unit 50-2.

The first and second cell mats 10 and 20 can be configured to dispose at a predetermined gap. In each of the first and second cell mats 10 and 20, four bit line pairs BL1 and /BL1 to BL4 and /BL4 can be disposed. The first sense amplifier 30-1 can be configured to dispose to correspond to the first and second bit line pairs BL1 and /BL1 and BL2 and /BL2 among the four bit line pairs in a gap between the first and second cell mats 10 and 20. The first sense amplifier 30-1 can be configured to amplify a positive first sensing line SL1 and a negative first sensing line /SL1 in response to a first bit line equalize signal 'bleq1'. The second sense amplifier 30-2 can be disposed to correspond to the third and fourth bit line pairs BL3 and /BL3 and BL4 and /BL4 among the fourth bit line pairs in the gap between the first and second cell mats 10 and 20. For example, the second sense amplifier 30-2 can be arranged vertical to the bit line pairs such that it is parallel to the first sense amplifier 30-1. The second sense amplifier 30-2 can be configured to amplify a positive second sensing line SL2 and a negative second sensing line /SL2 in response to the first bit line equalize signal 'bleq1'.

The first column selecting unit 40-1 can be configured to dispose between the first cell mat 10 and the first and second sense amplifiers 30-1 and 30-2. In response to the first and second column selection signals 'YS'<1:2>, the first column selecting unit 40-1 can be configured to connect the first sensing line pair SL1 and /SL1 can be configured to connect to the first sense amplifier 30-1 and the second sensing line pair SL2 and /SL2 can be configured to connect to the second sense amplifier 30-2 to positive first to fourth local data buses LI01 to LI04, respectively. The second column selecting unit 40-2 can be configured to dispose between the first and second sense amplifiers 30-1 and 30-2 and the second cell mat 20. In response to the third and fourth column selection signals 'YS'<3:4>, the second column selecting unit 40-2 can be configured to connect the first sensing line pair SL1 and /SL1 can be configured to connect to the first sense amplifier 30-1 and the second sensing line pair SL2 and /SL2 can be configured to connect to the second sense amplifier 30-2 to negative first to fourth local data buses /LI01 to /LI04, respectively.

The first share control unit 50-1 can be dispose between the first cell mat 10 and the first column selecting unit 40-1. In response to the second bit line equalize signal 'bleq2' and first and second share control signal pairs 'shcnt1' and '/shcnt1' and 'shcnt2' and '/shcnt2', the first share control unit 50-1 can be configured to connect the positive first sensing line SL1 and a positive first bit line BL1 or a positive second bit line BL2, and the positive second sensing line SL2 and a positive third bit line BL3 or a positive fourth bit line BL4. The second share control unit 50-2 can be dispose between the second column selecting unit 40-2 and the second cell mat 20. In response to the second bit line equalize signal 'bleq2' and the first and second share control signal pairs 'shcnt1' and '/shcnt1' and 'shcnt2' and '/shcnt2', the second share control unit 50-2 can be configured to connect the negative first sensing line /SL1 and a negative first bit line /BL1 or a negative second bit line /BL2, and the negative second sensing line /SL2 and a negative third bit line /BL3 or a negative fourth bit line /BL4.

In this case, the first and second bit line equalize signals 'bleq1' and 'bleq2' and the first and second share control signal pairs 'shcnt1' and '/shcnt1' and 'shcnt2' and '/shcnt2' can be generated from a command address decoder and it can be understood by those skilled in the art that the signals can be generated by changing the configuration of the command address decoder.

In this embodiment, each of the first and second sense amplifiers 30-1 and 30-2 can be configured to connect to the two bit line pairs. As a result, the same number of sense amplifiers as the bit line pairs are required in the related art, but the number of sense amplifiers can be reduced by half the number of bit line pairs. Further, the number of sense amplifiers decreases, which prevents extra space from being generated between the sense amplifiers. Thus, because the areas of the plurality of sense amplifiers can be secured, an area margin of the memory block can be increased.

In this case, as the described above, the first sense amplifier 30-1 and the second sense amplifier 30-2 can be configured to connect to a plurality of bit line pairs, and thus lines that can be detected and amplified by the sense amplifiers can be referred to as the first sensing line pair SL1 and /SL1 and the second sensing line pair SL2 and /SL2 such that names of the sensing line pairs can be discriminated from names of the bit line pairs. Because the bit line pairs and the sensing line pairs can be discriminated from each other, the bit line equalize signals used to perform a precharge operation can also be discriminated as the first bit line equalize signal 'bleq1' and the second bit line equalize signal 'bleq2'. The first bit line equalize signal 'bleq1' can be configured to allow the first sensing line pair SL1 and /SL1 and the second sensing line pair SL2 and /SL2 to be precharged with a level of a bit line precharge voltage Vblp. The second bit line equalize signal 'bleq2' can be configured to allow the positive first bit line BL1 and the positive second bit line BL2, the positive third bit line BL3 and the positive fourth bit line BL4, the negative first bit line /BL1 and the negative second bit line /BL2, and the negative third bit line /BL3 and the negative fourth bit line /BL4 to be precharged.

At the time of a normal operation of a semiconductor memory apparatus, the first bit line equalize signal 'bleq1' and the second bit line equalize signal 'bleq2' can be simultaneously enabled. Meanwhile, at the time of a refresh operation of a semiconductor memory apparatus, all of the bit lines that can be connected to the enabled sub-word lines among first to sixth sub-word lines SWL1 to SWL6 can be activated. At this time, the first share control signal pair 'shcnt1' and '/shcnt1' can have different enable periods, such that the positive first bit line BL1 and the positive second bit line BL2 are not configured to simultaneously connect to the positive first sensing line SL1. During a refresh operation, the first bit line equalize signal 'bleq1' can be enabled in order to precharge the first sensing line pair SL1 and /SL1, but the second bit line equalize signal 'bleq2' is not enabled in order to prevent the positive first bit line BL1 and the positive second bit line BL2 from connecting to each other.

In the first sense amplifier 30-1, if the positive first share control signal 'shcnt1' is enabled, the positive first sensing line SL1 can be configured to connect to the positive first bit line BL1 that can be configured connect to the first cell mat 10, and the negative first sensing line /SL1 can be configured to connect to the negative first bit line /BL1 that can be configured to connected to the second cell mat 20. Meanwhile, if the negative first share control signal 'shcnt2' is enabled, the positive first sensing line SL1 can be configured to connect to the positive second bit line BL2 that can be configured to connect to the first cell mat 10, and the negative first sensing line /SL1 can be configured to connect to the negative second bit line /BL2 that can be configured to connect to the second cell mat 20. Accordingly, when the positive first share control signal 'shcnt1' is enabled, the first sense amplifier 30-1 can be configured to amplify the first bit line pair BL1 and /BL1, and when the negative first share control signal '/shcnt1' is enabled, the first sense amplifier 30-1 can be configured to amplify the second bit line pair BL2 and /BL2.

Accordingly, a connection relationship between the sense amplifiers and the bit lines that is different from that in conventional circuit can be set and thus each of the first and second column selecting units 40-1 and 40-2 also can have a different structure from that in a conventional circuit. That is, the first column selecting unit 40-1 can be configured to operate in response to only the first and second column selection signals 'YS'<1:2>, and the second column selecting unit 40-2 can be configured to operate in response to only the third and fourth column selection signals 'YS'<3:4>.

As described above, in the semiconductor memory apparatus according to one embodiment, one sense amplifier can be configured to perform an amplification operation on two bit line pairs and control the amplification operation using the share control signals, which can be configured to reduce the amount of area loss of a memory block due to unnecessary arrangement of sense amplifiers.

Figure 4:
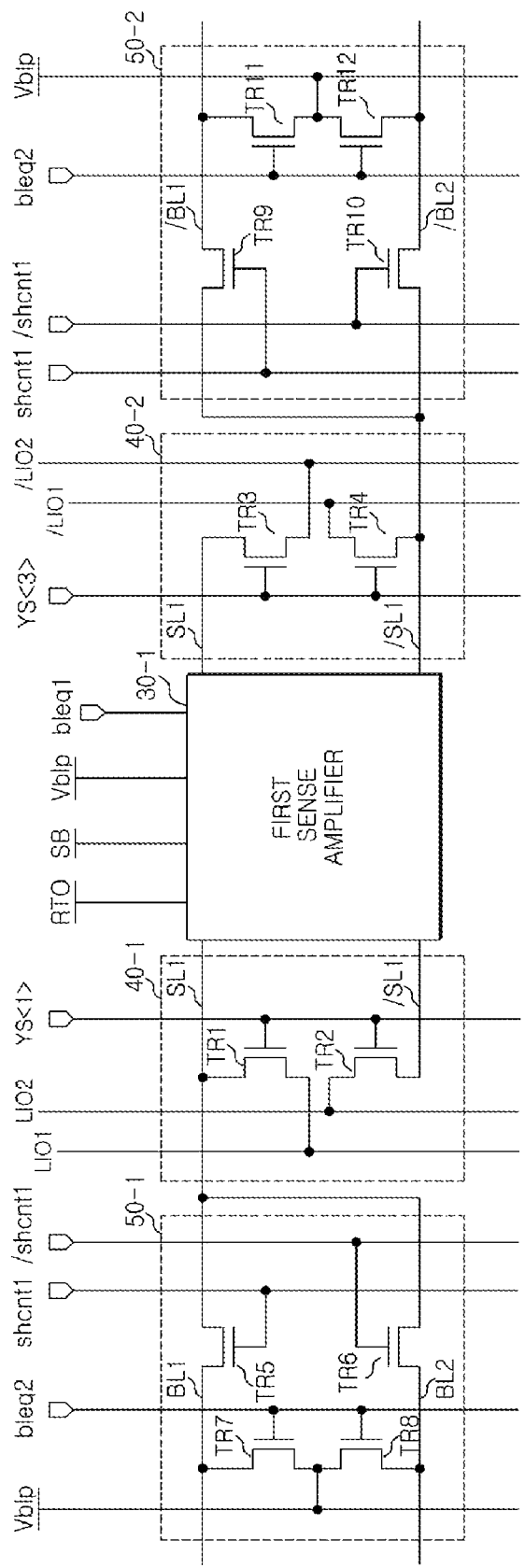
FIG. 4 is a diagram illustrating a detailed configuration of a memory block of THE semiconductor memory apparatus shown in FIG. 3 according to one embodiment.

FIG. 4 is a diagram illustrating a detailed configuration of a memory block of a semiconductor memory apparatus shown in FIG. 3 and in this case, for convenience of explanation, the first sense amplifier 30-1 is shown in a form of a block. Specifically, FIG. 4 shows partial configurations of the first column selecting unit 40-1, the second column selecting unit 40-2, the first share control unit 50-1, and the second share control unit 50-2.

The first sense amplifier 30-1 can be supplied with a first sense amplifier power supply voltage (hereinafter, referred to as RTO voltage RTO), a second sense amplifier power supply voltage (hereinafter, referred to as SB voltage SB), and a bit line precharge voltage Vblp, and can be configured to amplify the first sensing line pair SL1 and /SL1 in response to the first bit line equalize signal 'bleq1'. That is, if the first bit line equalize signal 'bleq1' is disabled, the first sense amplifier 30-1 can be configured to apply the RTO voltage RTO and the SB voltage SB or the SB voltage SB and the RTO voltage RTO to the first sensing line pair SL1 and /SL1, respectively. Meanwhile, if the first bit line equalize signal 'bleq1' is enabled, the first sense amplifier 30-1 can be configured to precharge the first sensing line pair SL1 and /SL1 with the bit line precharge voltage Vblp.

The first column selecting unit 40-1 can include a first transistor TR1 and a second transistor TR2. The first transistor TR1 can be provided between the positive first sensing line SL1 and the positive first local data bus LI01 and controlled by the first column selection signal 'YS'<1>. The second transistor TR2 can be provided between the negative first sensing line /SL1 and the positive second local data bus LI02 and controlled by the first column selection signal 'YS'<1>.

The second column selecting unit 40-2 can include a third transistor TR3 and a fourth transistor TR4. The third transistor TR3 can be provided between the positive first sensing line SL1 and the negative second local data bus /LI02 and controlled by the third column selection signal 'YS'<3>. The fourth transistor TR4 can be provided between the negative first sensing line /SL1 and the negative first local data bus /LI01 and controlled by the third column selection signal 'YS'<3>.

The first share control unit 50-1 can include a fifth transistor TR5, a sixth transistor TR6, a seventh transistor TR7, and an eighth transistor TR8. The fifth transistor TR5 can be provided between the positive first sensing line SL1 and the positive first bit line BL1 that can be configured to connect to the first cell mat 10 and to be controlled by the positive first share control signal 'shcnt1'. The sixth transistor TR6 can be provided between the positive first sensing line SL1 and the positive second bit line BL2 that can be configured to connect to the first cell mat 10 and to be controlled by the negative first share control signal '/shcnt1'. The seventh transistor TR7 can be provided between the positive first bit line BL1 that can be configured to connect to the first cell mat 10 and a supply terminal of the bit line precharge voltage Vblp and to be controlled by the second bit line equalize signal 'bleq2'. The eighth transistor TR8 can be provided between the positive second bit line BL2 that can be configured to connect to the first cell mat 10 and the supply terminal of the bit line precharge voltage Vblp and to be controlled by the second bit line equalize signal 'bleq2'.

The second share control unit 50-2 can include a ninth transistor TR9, a tenth transistor TR10, an eleventh transistor TR11, and a twelfth transistor TR12. The ninth transistor TR9 can be provided between the negative first sensing line /SL1 and the negative first bit line /BL1 that can be configured to connect to the second cell mat 20 and to be controlled by the positive first share control signal 'shcnt1'. The tenth transistor TR10 can be provided between the negative first sensing line /SL1 and the negative second bit line /BL2 that can be configured to connect to the second cell mat 20 and to be controlled by the negative first share control signal '/shcnt1'. The eleventh transistor TR11 can be provided between the negative first bit line /BL1 that can be configured to connect to the second cell mat 20 and the supply terminal of the bit line precharge voltage Vblp and to be controlled by the second bit line equalize signal 'bleq2'. The twelfth transistor TR12 can be provided between the negative second bit line /BL2 that can be configured to connect to the second cell mat 20 and the supply terminal of the bit line precharge voltage Vblp and to be controlled by the second bit line equalize signal 'bleq2'.

In this configuration, if the positive first share control signal 'shcnt1' is enabled, the positive first sensing line SL1 can be configured to connect to the positive first bit line BL1 that can be configured to connect to the first cell mat 10, and the negative first sensing line /SL1 can be configured connected to the negative first bit line /BL1 that can be configured to connect to the second cell mat 20. Meanwhile, if the negative first share control signal '/shcnt1' is enabled, the positive first sensing line SL1 can be configured to connect to the positive second bit line BL2 that can be configured to connected to the first cell mat 10, and the negative first sensing line /SL1 can be configured to connect to the negative second bit line /BL2 that can be configured to connect to the second cell mat 20.

If a refresh operation is performed in the first cell mat 10 or the second cell mat 20, the second bit line equalize signal 'bleq2' can be disabled in order to prevent the positive first bit line BL1 and the positive second bit line BL2 or the negative first bit line /BL1 and the negative second bit line /BL2 from being connected to each other. During periods other than a refresh operation period, the second bit line equalize signal 'bleq2' can have the same enable period as the first bit line equalize signal 'bleq1', which is input to the first sense amplifier 30-1.

Figure 5A:
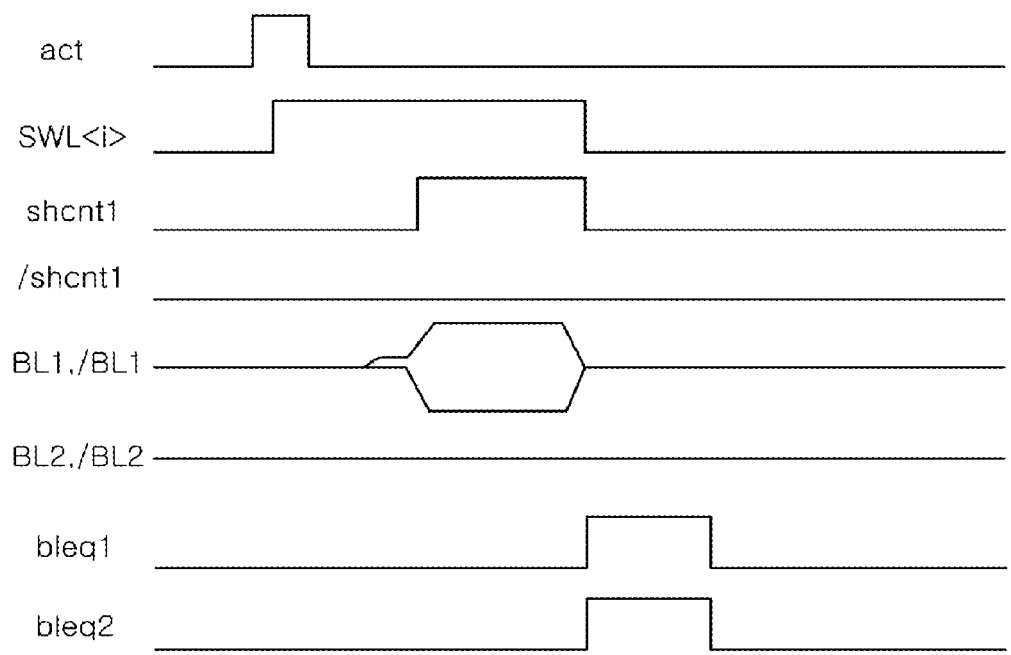
FIG. 5A is a timing chart illustrating a normal operation of the memory block shown in FIG. 3.
Figure 5B:
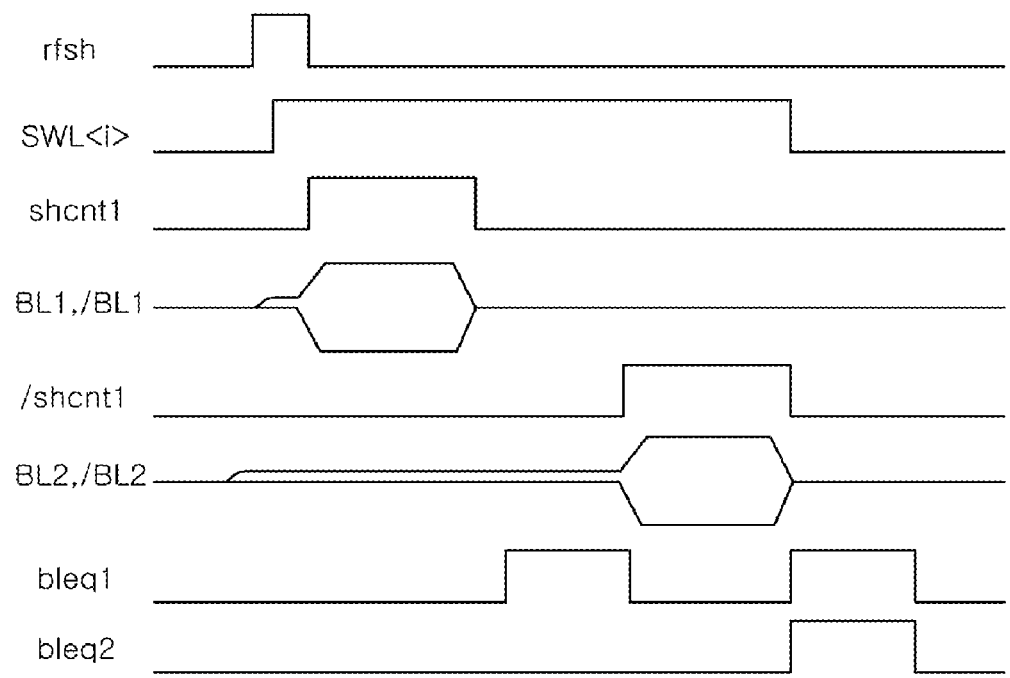
FIG. 5B is a timing chart illustrating a refresh operation of the memory block shown in FIG. 3.

FIG. 5A is a timing chart illustrating a normal operation of a memory block for a semiconductor memory apparatus shown in FIG. 3, and FIG. 5B is a timing chart illustrating a refresh operation of a memory block for a semiconductor memory apparatus shown in FIG. 3.

Referring to FIG. 5A, at the time of a normal operation, during a period in which an arbitrary sub-word line SWL<i> is activated after an active signal act is enabled, the positive first share control signal 'shcnt1' can be enabled but the negative first share control signal '/shcnt1' can be disabled. As a result, the first bit line pair BL1 and /BL1 can be activated, but the second bit line pair BL2 and /BL2 cannot be activated. The first bit line equalize signal 'bleq1' and the second bit line equalize signal 'bleq2' can be enabled after the arbitrary sub-word line SWL<i> is inactivated.

Referring to FIG. 5B, during a period in which the arbitrary sub-word line SWL<i> is activated after a refresh signal 'rfsh' is enabled, if the positive first share control signal 'shcnt1' is enabled, the first bit line pair BL1 and /BL1 can be activated, and if the negative first share control signal '/shcnt1' is enabled, the second bit line pair BL2 and /BL2 can be activated. In this case, the first bit line equalize signal 'bleq1' can be enabled between enable periods of the positive first share control signal 'shcnt1' and the negative first share control signal '/shcnt1', and the first sensing line pair SL1 and /SL1 can be configured to be precharged by the first bit line equalize signal 'bleq1'. In order to prevent the positive first bit line BL1 and the positive second bit line BL2 or the negative first bit line /BL1 and the negative second bit line /BL2 from being connected to each other, the second bit line equalize signal 'bleq2' is not enabled. The first bit line equalize signal 'bleq1' and the second bit line equalize signal 'bleq2' can be enabled after the arbitrary sub-word line SWL<i> is inactivated.

As described above, in the semiconductor memory apparatus according to the embodiments described herein, one sense amplifier can be configured to perform an amplification operation on two bit line pairs. In order to support this configuration, it can be required to appropriately control a connection relationship between sense amplifiers and bit line pairs using a plurality of share control signals. In order to support a smooth refresh operation, a separate bit line equalize signal can be used. In the above-described structure, it is feasible to prevent unnecessary extra areas from being generated due to inefficient arrangement of sense amplifiers.

Further, an area margin in a memory block can be increased, which can achieve high-integration of a semiconductor memory apparatus.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor memory apparatus comprising:
   a cell mat configured to include a plurality of memory cells to which a first bit line pair or a second bit line pair is connected;
   a sense amplifier configured to amplify a positive sensing line and a negative sensing line in response to a first bit line equalize signal;
   a column selecting unit configured to connect the positive sensing line and the negative sensing line to a first data bus and a second data bus, respectively, in response to a column selection signal; and
   a share control unit configured to connect the positive sensing line and a positive first bit line of the first bit line pair or a positive second bit line of the second bit line pair in response to a second bit line equalize signal, a positive share control signal and a negative share control signal,
   wherein, when the first bit line equalize signal is disabled, the sense amplifier configured to apply a first sense amplifier power supply voltage and a second sense amplifier power voltage or the second sense amplifier power supply voltage and the first sense amplifier power supply voltage to the positive sensing line and the negative sensing line, respectively, and
   when the first bit line equalize signal is enabled, the sense amplifier configured to precharge the positive sensing line and the negative sensing line with a bit line precharge voltage level.

2. A semiconductor memory apparatus comprising:
   a cell mat configured to include a plurality of memory cells to which a first bit line pair or a second bit line pair is connected;
   a sense amplifier configured to amplify a positive sensing line and a negative sensing line in response to a first bit line equalize signal;
   a column selecting unit configured to connect the positive sensing line and the negative sensing line to a first data bus and a second data bus, respectively, in response to a column selection signal; and
   a share control unit configured to connect the positive sensing line and a positive first bit line of the first bit line pair or a positive second bit line of the second bit line pair in response to a second bit line equalize signal, a positive share control signal and a negative share control signal,
   wherein the share control unit is configured to connect the positive sensing line and the positive first bit line when the positive share control signal is enabled and the positive sensing line and the positive second bit line when the negative share control signal is enabled.

3. The semiconductor memory apparatus of claim 2, wherein the share control unit is configured to connect the positive first bit line and the positive second bit line when the second bit line equalize signal is enabled.

4. The semiconductor memory apparatus of claim 2, wherein the positive share control signal, the negative share control signal, the first bit line equalize signal, and the second bit line equalize signal are generated from a command address decoder, and
   the second bit line equalize signal is disabled during a refresh operation.

5. A semiconductor memory apparatus comprising:
   a first cell mat configured to have a plurality of positive bit lines and negative bit lines alternately disposed therein;
   a second cell mat configured to be disposed apart from the first cell mat at a predetermined distance and to have a plurality of negative bit lines and positive bit lines alternately disposed therein; and
   a sense amplifier configured to amplify a plurality of positive and negative bit lines of the first and second cell mats in response to first and second bit line equalize signals, a positive share control signal and a negative share control signal,
   wherein the sense amplifier is configured to amplify the positive first bit line of the first cell mat and the negative first bit line of the second cell mat when the positive share control signal is enabled, and detects and amplifies the positive second bit line of the first cell mat and the negative second bit line of the second cell mat when the negative share control signal is enabled.

6. A semiconductor memory apparatus comprising:
   a first cell mat configured to have a plurality of positive bit lines and negative bit lines alternately disposed therein;
   a second cell mat configured to be disposed apart from the first cell mat at a predetermined distance and to have a plurality of negative bit lines and positive bit lines alternately disposed therein; and
   a sense amplifier configured to amplify a plurality of positive and negative bit lines of the first and second cell mats in response to first and second bit line equalize signals, a positive share control signal and a negative share control signal,
   wherein, at the time of a normal operation, when the first and second bit line equalize signals are disabled, the sense amplifier is configured to apply a first sense amplifier power supply voltage and a second sense amplifier power supply voltage or the second sense amplifier power supply voltage and the first sense amplifier power supply voltage to the positive first bit line and the negative first bit line or the positive second bit line and the negative second bit line, respectively, and
   when the first and second bit line equalize signals are enabled, the sense amplifier is configured to precharge the positive first bit line, the negative first bit line, the positive second bit line, and the negative second bit line with a bit line precharge voltage level.

7. The semiconductor memory apparatus of claim 6, wherein, at the time of a refresh operation, when the first bit line equalize signal is disabled, the sense amplifier is configured to apply the first sense amplifier power supply voltage and the second sense amplifier power supply voltage or the second sense amplifier power supply voltage and the first sense amplifier power supply voltage to the positive first bit line and the negative first bit line or the positive second bit line and the negative second bit line, respectively, and when the first bit line equalize signal is enabled, each of the sense amplifiers precharges the detected and amplified bit line pair with the bit line precharge voltage level, and
   when the refresh operation is completed and the first and second bit line equalize signals are enabled, the sense amplifier is configured to precharge the positive first bit line, the negative first bit line, the positive second bit line, and the negative second bit line with the bit line precharge voltage level.

8. The semiconductor memory apparatus of claim 7, wherein the positive share control signal, the negative share control signal, the first bit line equalize signal, and the second bit line equalize signal are generated from a command address decoder, and the second bit line equalize signal is disabled at the time of the refresh operation.

\* \* \* \* \*